United States Patent
Song et al.

(10) Patent No.: US 11,175,693 B2
(45) Date of Patent: Nov. 16, 2021

(54) FOLDABLE DISPLAY DEVICE AND METHOD OF FABRICATING THE SAME

(71) Applicant: LG Display Co., Ltd., Seoul (KR)

(72) Inventors: NaYoung Song, Paju-si (KR); JungMin Lee, Seoul (KR); HyeSun Song, Paju-si (KR); YeonJae Jeong, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/230,608

(22) Filed: Dec. 21, 2018

(65) Prior Publication Data
US 2019/0204867 A1 Jul. 4, 2019

(30) Foreign Application Priority Data
Dec. 29, 2017 (KR) .................. 10-2017-0183800

(51) Int. Cl.
*G06F 1/16* (2006.01)
*G09G 3/3208* (2016.01)
*H01L 51/00* (2006.01)
*H01L 27/32* (2006.01)

(52) U.S. Cl.
CPC .......... *G06F 1/1616* (2013.01); *G06F 1/1641* (2013.01); *G06F 1/1652* (2013.01); *G09G 3/3208* (2013.01); *H01L 27/32* (2013.01); *H01L 51/0097* (2013.01)

(58) Field of Classification Search
CPC .......... G06F 11/13616; G06F 1/13641; G06F 1/1652; H01K 51/0097; G02F 1/133305; G02F 2202/28
See application file for complete search history.

(56) References Cited

U.S. PATENT DOCUMENTS

| | | | |
|---|---|---|---|
| 10,368,452 B2 * | 7/2019 | Yun | G09F 9/301 |
| 2018/0103553 A1 * | 4/2018 | Kim | H05K 5/0017 |
| 2019/0081254 A1 * | 3/2019 | Wang | H01L 51/5246 |

* cited by examiner

*Primary Examiner* — Richard H Kim
(74) *Attorney, Agent, or Firm* — Birch, Stewart, Kolasch & Birch, LLP

(57) ABSTRACT

A foldable display device can include a display panel including a folding area and a non-folding area; a rigid member disposed under the display panel, the rigid member including an opening pattern corresponding to the folding area; a support member disposed under the rigid member; and an adhesive member disposed between the support member and the rigid member, in which the adhesive member includes a non-adhesive portion disposed between the support member and the rigid member, the non-adhesive portion of the adhesive member overlaps with the opening pattern in the rigid member, and the non-adhesive portion of the adhesive member overlaps with the folding area of the display panel.

14 Claims, 10 Drawing Sheets

FOLDABLE DISPLAY DEVICE AND METHOD OF FABRICATING THE SAME

CROSS-REFERENCE TO RELATED APPLICATIONS

This application claims the benefit of priority of Korean Patent Application No. 10-2017-0183800 filed in the Republic of Korea on Dec. 29, 2017, the entirety of which is incorporated herein by reference.

BACKGROUND

Technical Field

The present disclosure relates to a foldable display device in which an adhesive member has a non-adhesive portion.

Description of the Related Art

Image display devices which display various information on the screen are the core technology of the era of information and communications. Such display devices include a cathode-ray tube display panel, a liquid-crystal display panel, an electrophoretic display panel, an organic light-emitting display panel, and the like.

In particular, in order to implement thinner, lighter, portable and high-performance image display devices, an organic light-emitting display panel for displaying images by controlling the amount of light emitted from an organic light-emitting element has been attracting attention.

An organic light-emitting display panel is capable of producing light on its own and thus does not require any additional light source (e.g., OLED panels do not need a backlight). Therefore, an organic light-emitting display panel can be made lighter and thinner. In addition, since an organic light-emitting display panel can be produced to be very thin, it is advantageous for implementing a foldable display device.

SUMMARY

A display panel employed by a foldable display device includes a substrate having flexibility and thus can be folded. Although the display panel having the flexible substrate can be easily folded, it may sag due to the weight of the elements thereon. In addition, the elements on the display panel may also sag or deform.

In order to suppress sagging of the display panel, an element for supporting the substrate may be disposed under the substrate. For example, a mid-frame made of a rigid material may be disposed under the display panel to support it. Unfortunately, since the mid-frame is hard, there is a problem that the display panel does not easily when the foldable display device is folded. To make the display panel fold easily, a portion of the mid-frame may be removed where the display panel is folded.

Although the display panel can be folded easily in this manner, the portion where the display panel is folded may sag or deform. Such sagging in the folding area may result in unevenness, which may be noticeable by a viewer when images are displayed on the display panel.

In view of the above, the inventors of the application have recognized that it is desirable to suppress sagging in the folding area of a foldable display device while also allowing it to be easily folded. Accordingly, the inventors of the application have devised a novel structure that can suppress uneven or sagging portions even while allowing a foldable display device to be easily folded.

An object of the present disclosure is to provide a foldable display device including: a display panel comprising a folding area, and a non-folding area extended from the folding area in at least a direction; a rigid member disposed under the display panel and having an opening pattern corresponding to the folding area; a support member under the rigid member; and an adhesive member between the support member and the rigid member within the non-folding area. The adhesive member includes a non-adhesive portion that is extended to an area corresponding to the folding area between the support member and the rigid member to be disposed under the opening pattern.

Another object of the present disclosure is to provide a method of fabricating a foldable display device comprising a display panel including a folding area and a non-folding area extended from the folding area in at least a direction. The method includes forming an adhesive member, and the forming the adhesive member comprises suppressing an adhesive strength of a part of the adhesive member corresponding to the folding area.

Another object of the present disclosure is to provide a foldable display device including a flexible substrate including a foldable region and a non-foldable region; and an adhesive member having a first adhesive layer configured to be attached to a rear surface of the flexible substrate, and a second adhesive layer disposed on a rear side of the first adhesive layer and configured to be attached to a different support frame.

Details of embodiments of the subject matter described in this specification are set forth in the accompanying drawings and the description below.

According to an example embodiment of the present disclosure, in a foldable display device, an adhesive member includes a non-adhesive portion, so that deformation in a folding area of a display panel is reduced, thereby suppressing an uneven surface from being perceived.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
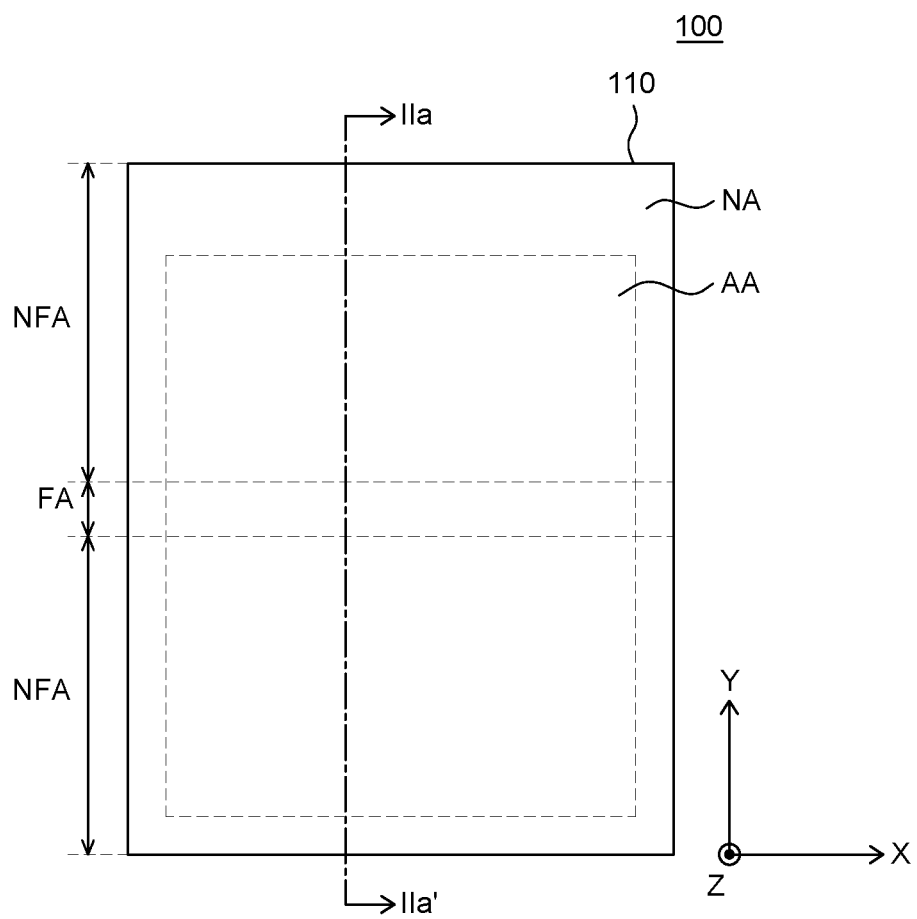
FIG. 1 is a plan view of a foldable display device according to an embodiment of the present disclosure.

Advantages and features of the present invention and methods to achieve them will be elucidated from embodiments described below in detail with reference to the accompanying drawings. However, the present disclosure is not limited to embodiments disclosed herein but may be implemented in various different ways. The embodiments are provided as examples for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g., "a," "an," "the," this includes a plural of that noun unless specifically stated otherwise. In describing elements, they are interpreted as including error margins even without explicit statements.

In describing positional relationship, such as "an element A on an element B," "an element A above an element B," "an element A below an element B," and "an element A next to an element B," another element C may be disposed between the elements A and B unless the term "directly" or "immediately" is explicitly used. As used herein, a phrase "an element A on an element B" refers to that the element A may be disposed directly on the element B and/or the element A may be disposed indirectly on the element B via another element C. As used herein, phrases "an element A connected to an element B" or "an element A coupled with an element B" refer to that the element A may be directly connected to/coupled with the element B, that that another element C may be interposed between the element A and the element B, and/or that the element A may be indirectly connected to/coupled with the element B via another element C.

The terms first, second and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

Like reference numerals denote like elements throughout the descriptions.

The relative dimensions of various elements in the drawings are depicted schematically and not necessarily to scale.

Features of various embodiments of the present disclosure can be combined partially or totally. As will be appreciated by those skilled in the art, technically various interactions and operations are possible. Various embodiments can be practiced individually or in combination.

Hereinafter, example embodiments of the present disclosure will be described in detail with reference to the accompanying drawings.

FIG. 1 is a plan view of a foldable display device according to an embodiment of the present disclosure. For convenience of illustration, FIG. 1 shows only a display panel 110 among a variety of elements of a foldable display device 100.

The display panel 110, which displays images, can include organic light-emitting elements for displaying images (e.g., OLEDs), and circuitry, wiring and parts for driving the organic light-emitting elements.

The display panel 110 includes an active area AA, a non-active area NA, a folding area FA, and a non-folding area NFA.

In the active area AA which displays images, an array of pixels including organic light-emitting elements is disposed. In the active area AA, organic light-emitting elements for displaying images and circuitry for driving the organic light-emitting elements can be disposed. In the following description, it is assumed that the foldable display device 100 includes the display panel 110 including organic light-emitting elements (e.g., OLEDs). The present disclosure, however, is not limited thereto.

The circuitry can include a variety of thin-film transistors, capacitors and wirings for driving the organic light-emitting elements. For example, the circuitry can include, but is not limited to, a driving thin-film transistor, a switching thin-film transistor, a storage capacitor, a gate line, a data line, and the like.

In the non-active area NA which does not display images, circuitry, wiring and elements for driving the organic light-emitting elements in the active area AA are disposed. Various integrated circuits (ICs), such as a gate driver IC and a data driver IC can be disposed in the non-active area NA. For example, a variety of ICs and driver circuits can be mounted in the non-active area NA of the display panel 110 as a GIP (Gate In Panel) or can be connected to the display panel 110 as a TCP (Tape Carrier Package), a COF (Chip On Film) or the like.

The display panel 110 can also be divided into a folding area FA and a non-folding area NFA, as well as the active area AA and the non-active area NA.

The folding area (or the folding part) FA is a portion of the display panel 110 that is folded when the display device 100 is folded. The folding area FA can include a part of the active area AA and a part of the non-active area NA. In the following description, an example will be described where the folding area FA includes a part of the active area AA and a part of the non-active area NA. The present disclosure, however, is not limited thereto. In another example, the non-active area NA can be formed only at a part of the outer side of the active area AA (e.g., some sides of the active area AA can be bezeless). Then, the folding area FA can include a part of the active area AA only.

The folding area FA can be folded at a specific radius of curvature with respect to the folding axis. Specifically, the folding axis can be the x-axis. When the folding area FA is folded with respect to the folding axis, the folding area FA can form a part of a curve, a circle or an ellipse. The radius of curvature of the folding area FA refers to the radius of a curve, a circle or an ellipse formed by the folding area FA. In the following description, the folding axis in the x-axis direction is located in the folding area FA, and the non-folding area NFA is extended in the y-axis direction from the folding area FA and perpendicular to the folding axis, for example. The present disclosure, however, is not limited thereto.

The non-folding area (or non-folding part) NFA is a part of the display panel 110 that is not folded when the foldable display device 100 is folded. In other words, the non-folding area NFA remains flat even when the foldable display device 100 is folded. The non-folding area NFA can include a part of the active area AA and a part of the non-active area NA.

The non-folding area NFA can be formed on either side of the folding area FA. For example, the non-folding area NFA can be extended in the y-axis direction with respect to the folding axis. The folding area FA can be defined between the non-folding areas NFA. Therefore, when the display panel 110 is folded with respect to the folding axis, non-folding areas NFA can face each other.

Hereinafter, the foldable display device 100 will be described in detail with reference to FIG. 2.

Figure 2:
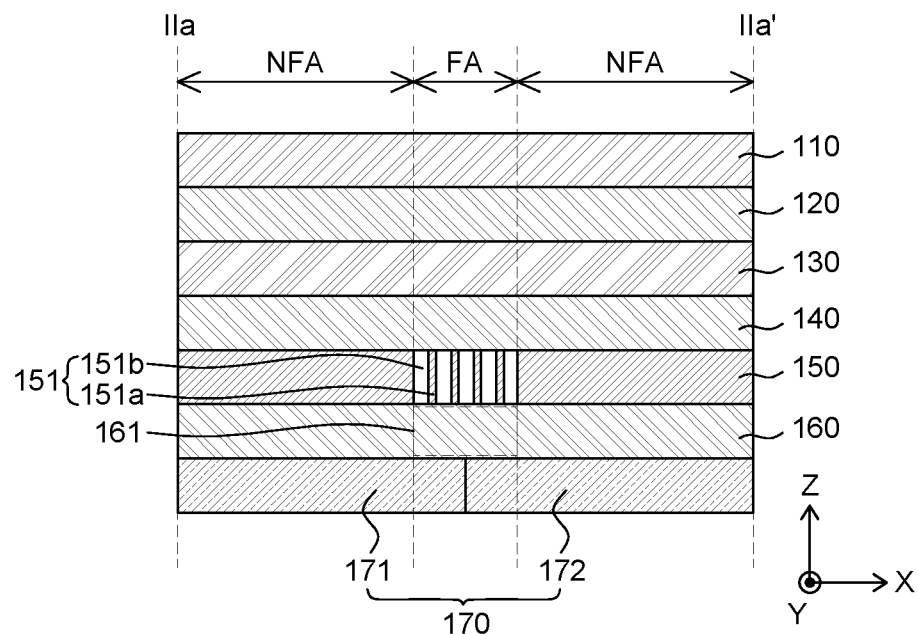
FIG. 2 is a cross-sectional view of a foldable display device according to an embodiment of the present disclosure.

FIG. 2 is a cross-sectional view of a foldable display device according to an embodiment of the present disclosure. FIG. 2 is a cross-sectional view of the foldable display device, taken along line IIa-IIa' of FIG. 1.

As shown in FIG. 2, the foldable display device 100 includes a display panel 110, a first adhesive member 120, a support substrate 130, a second adhesive member 140, a rigid member 150, a third adhesive member 160, and a support member 170.

The display panel (or image display member) 110 includes a substrate. The substrate included in the display panel 110 can be made of a plastic material having flexibility and thus, is a foldable, flexible substrate. For example, a process of fabricating the foldable display device 100 can be performed with a substrate for fabricating a panel, which is made of glass, is disposed, and then elements including a polarizing plate can be disposed on the display panel 110, to realize the substrate for fabricating a panel.

The support substrate 130 is disposed under the display panel 110. The support substrate 130 can be uniformly disposed over the entire area under the display panel 110. The support substrate 130 is both rigid enough for supporting the display panel 110 and flexible for being folded. The supporting substrate 130 can be, for example, made of a polymer material having excellent flexibility, such as polyurethane (PU). The support substrate 130 can have, but is not limited to, a thickness of approximately 50 μm or less.

The first adhesive member 120 is disposed between the display panel 110 and the support substrate 130. The first adhesive member 120 can be uniformly disposed on and across the entire upper surface of the support substrate 130 to thereby attach the display panel 110 to the support substrate 130. The first adhesive member 120 can be made of, but is not limited to, a transparent adhesive, such as an OCR (optical clear resin) and an OCA (optical clear adhesive).

The rigid member 150 can be disposed under the support substrate 130. The rigid member 150 is made of a rigid material and is disposed under the display panel 110 to support the display panel 110. In addition, the rigid member 150 supports the foldable display device 100 including the display panel 110 so that the foldable display device 100 maintains its shape. The rigid member 150 has an opening pattern 151 corresponding to the folding area FA of the display panel 110. The opening pattern 151 can have a structure in which blocking portions (or blocking regions) 151a and open portions (or open regions) 151b are continuously and alternately arranged. With such structure, the opening pattern 151 of the rigid member 150 allows a part of the rigid member 150 corresponding to the folding area FA of the display panel 110 to be folded. The rigid member 150 can have, but is not limited to, a thickness of approximately 0.18 mm to 0.22 mm.

The second adhesive member 140 can be disposed between the support substrate 130 and the rigid member 150. The second adhesive member 140 can be uniformly disposed on and across the entire lower surface of the support substrate 130 to thereby attach the support substrate 130 to the rigid member 150. The second adhesive member 140 can be made of, but is not limited to, the same material as the first adhesive member 120.

The support member 170 can be disposed under the rigid member 150. The support member 170 protects the elements thereon from impact. Accordingly, the support member 170 can be rigid.

The support member 170 can include a first support member 171 and a second support member 172. The boundary between the first support member 171 and the second support member 172 corresponds to the folding area FA. Therefore, when the foldable display device 100 is folded, the first support member 171 can be spaced apart from the second support member 172 in the folding area FA.

As the foldable display device 100 is repeatedly folded and unfolded, the parts of a number of elements of the foldable display device 100 corresponding to the folding area FA may receive pressure continuously. As a result, the part of the foldable display device 100 corresponding to the folding area FA may be caved in and deformed.

In addition, even when the foldable display device 100 is unfolded, the number of elements thereof may have a large flexibility and a small thickness. The rigid member has the opening pattern corresponding to the folding area FA of the display panel 110. Therefore, the part of the foldable display device 100 corresponding to the folding area FA is weaker than the part thereof corresponding to the non-folding area NFA, and thus it may sag by the weight of the elements disposed above the opening pattern.

Accordingly, a feature that can suppress the part of the foldable display device 100 corresponding to the folding area FA from sagging, being caved in and/or deformed is desirable.

A part of the third adhesive member 160 can be utilized as the feature to suppress caved-in and sagging.

The third adhesive member 160 can be disposed between the support member 170 and the rigid member 150. The third adhesive member 160 can correspond to the non-folding area NFA of the display panel 110 and can be extended to the folding area FA. A part of the third adhesive member 160 corresponding to the folding area FA can be located under the opening pattern 151 of the rigid member 150.

The part of the third adhesive member 160 located under the opening pattern 151 of the rigid member 150 can have no adhesive strength. In other words, the part of the third adhesive member 160 is a non-adhesive portion 161 that is not attached to the opening pattern 151 of the rigid member 150. For example, the third adhesive member 160 can be a partially adhesive member including an adhesive portion and the non-adhesive portion 161.

The non-adhesive portion 161 of the third adhesive member 160 can come in contact with the blocking portions 151a of the opening pattern 151 of the rigid member 150 to support the opening pattern 151. The opening pattern 151 of the rigid member 150 includes the open portions 151b so that the blocking portions 151a of the opening pattern 151 can come in contact with the elements above the opening pattern 151. Therefore, even though the blocking portions 151a of the opening pattern 151 of the rigid member 150 support the elements above the opening pattern 151, the pressure when the foldable display device 100 is folded or the weight of the elements above the opening pattern 151 can be transferred to the non-adhesive portion 161 of the third adhesive member 160 via the blocking portions 151a of the opening pattern 151. As a result, the pressure or the weight can be spread or transferred to the support member 170 which is in contact with the non-adhering portion 161 of the third adhesive member 160 corresponding to the folding area FA of the display panel 110.

In other words, the non-adhesive portion 161 of the third adhesive member 160 can suppress the part of the display panel 110 located on the rigid member 150 corresponding to the folding area FA from being caved in or sagging. Therefore, it is possible to reduce the deformation in the folding area FA of the display panel 110. As a result, it is possible to suppress a caved-in portion from being generated and perceived in the folding area FA of the display panel 110.

In addition, the non-adhesive portion 161 of the third adhesive member 160 is attached neither to a part of the first support member 171 nor to a part of the second support member 172 corresponding to the folding area FA. Accordingly, when the display panel 110 is folded such that the first support member 171 and the second support member 172 are separated from each other, the non-adhesive portion 161 of the third adhesive member 160 may be separated from the first support member 171 and the second support member 172 (e.g., the non-adhesive portion 161 can slide against portions of the first and second support members 171 and 172). As a result, the non-adhesive portion 161 of the third adhesive member 160 has little to no effect on the flexibility of the display device 100.

Figure 3:
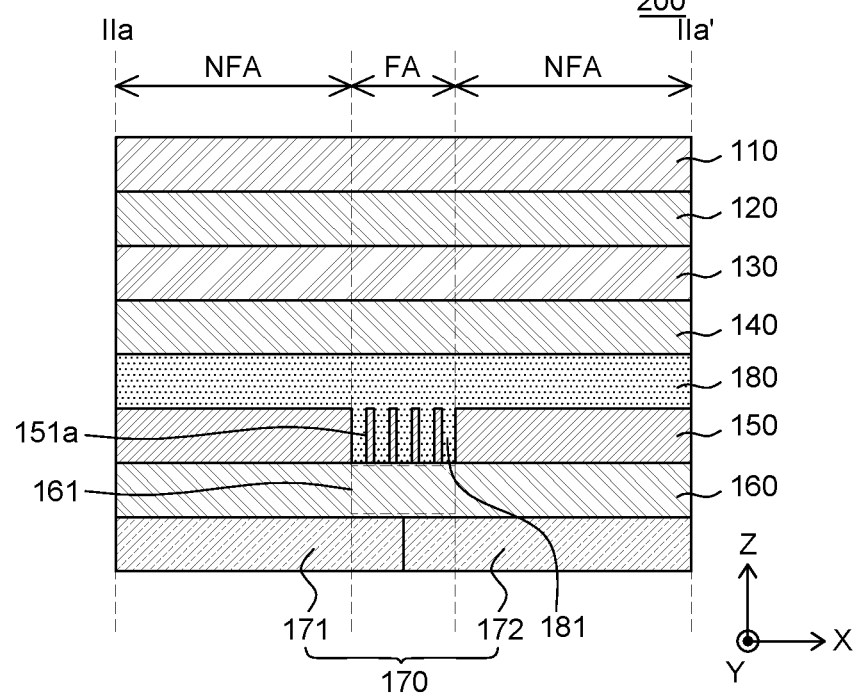
FIG. 3 is a cross-sectional view of a foldable display device according to another embodiment of the present disclosure.

FIG. 3 is a cross-sectional view of a foldable display device according to another embodiment of the present disclosure.

The cross-sectional view of a foldable display device 200 shown in FIG. 3 is identical to the cross-sectional view of the foldable display device 100 shown in FIG. 2 except for that the display device 200 further includes a flexibility-improving adhesive layer 180 and has a different structure associated with it; and, therefore, the redundant description will be omitted.

The flexibility-improving adhesive layer 180 is disposed between the display panel 110 and the rigid member 150. The flexibility-improving adhesive layer 180 can be attached to and formed integrally with the rigid member 150. Therefore, the flexibility-improving adhesive layer 180 can be disposed between the rigid member 150 and the second adhesive member 140.

The flexibility-improving adhesive layer 180 can be formed of a material having elasticity for suppressing impact from being transferred to the display panel 110 as well as flexibility for folding the display device 100. Therefore, the flexibility-improving adhesive layer 180 can protect the display panel 110 disposed above the second adhesive member 140. For example, the flexibility-improving adhesive layer 180 can be made of, but is not limited to, a material such as silicon (Si).

The flexibility-improving adhesive layer 180 can include extended portions 181. The extended portions 181 of the flexibility-improving adhesive layer 180 can correspond to the folding area FA of the display panel 110.

Specifically, the flexibility-improving adhesive layer 180 can be attached to and formed integrally with the rigid member 150. The extended portions 181 of the flexibility-improving adhesive layer 180 can be formed in line with the opening pattern 151 of the rigid member 150 corresponding to the folding area FA of the display panel 100. The extended portions 181 of the flexibility-improving adhesive layer 180 can extend into the open portions 151b of the opening pattern 151, respectively. Accordingly, the open portions 151b of the opening pattern 151 can be filled with the extended portions 181 of the flexibility-improving adhesive layer 180, respectively. Accordingly, in the opening pattern 151 of the rigid member 150, the blocking portions 151a of the opening pattern 151 and the extended portions 181 of the flexibility-improving adhesive layer 180 can be continuously and alternately arranged.

The non-adhesive portion 161 of the third adhesive member 160 corresponding to the folding area FA of the display panel 110 is located under the extended portions 181 of the flexibility-improving adhesive layer 180. The extended portions 181 of the flexibility-improving adhesive layer 180 have an adhesive strength. Thus, the extended portions 181 of the flexibility-improving adhesive layer 180 and the surfaces of the blocking portions 151a of the opening pattern 151 can come in contact with the non-adhesive portion 161 of the third adhesive member 160. Thus, the extended portions 181 of the flexibility-improving adhesive layer 180 can be partially attached to the non-adhesive portion 161 of the third adhesive member 160 (e.g., lower portions or a lower surface of the extend portions 181 can be stuck to the non-adhesive portion 161, due to adhesive properties of the flexibility-improving adhesive layer 180).

Accordingly, when the display panel 110 is folded, the upper surface of the non-adhesive portion 161 of the third adhesive member 160 is attached to the extended portions 181 of the flexibility-improving adhesive layer 180, so that the non-adhesive portion 161 of the third adhesive member 160 do not fluctuate (e.g., lower portions of the extend portions 181 are to the non-adhesive portion 161 and do not separate from each other even when folded). Therefore, even when the display panel 110 is folded, the elements disposed above the opening pattern 151 of the rigid member 150 corresponding to the folding area FA can be supported by the non-adhesive portion 161 of the third adhesive member 160.

For example, even when the display panel 100 is folded, the non-adhesive portion 161 of the third adhesive member 160 can suppress the part of the display panel 110 located on the rigid member 150 corresponding to the folding area FA from being caved in or sagging. Therefore, it is possible to reduce the deformation in the folding area FA of the display panel 110. As a result, it is possible to suppress a caved-in shape from being generated and perceived in the folding area FA of the display panel 110.

Figure 4:
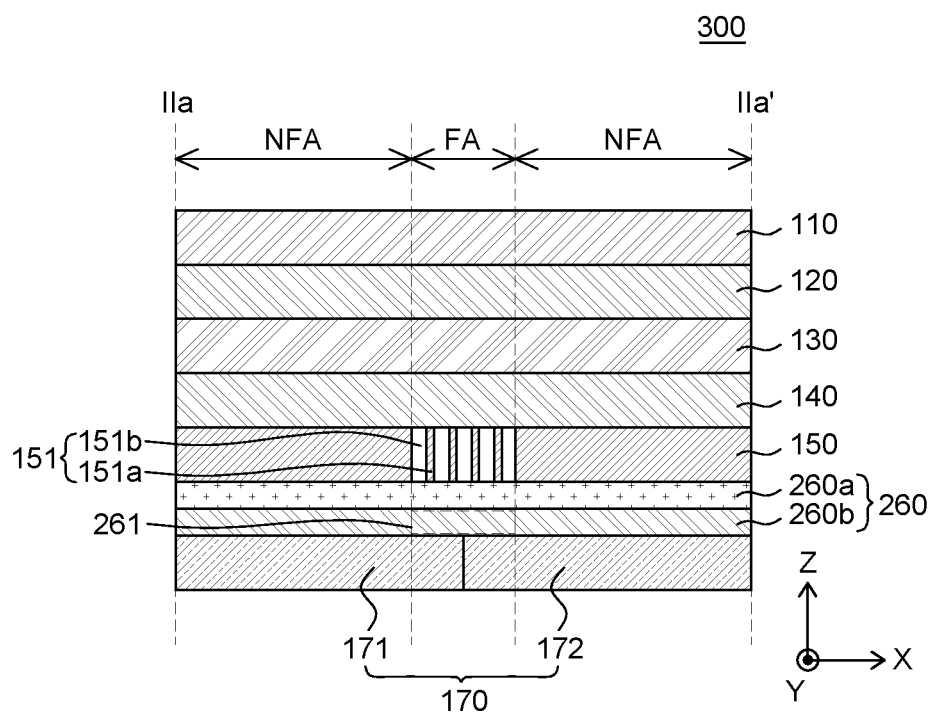
FIG. 4 is a cross-sectional view of a foldable display device according to an embodiment of the present disclosure.

FIG. 4 is a cross-sectional view of a foldable display device according to another embodiment of the present disclosure.

The cross-sectional view of a foldable display device 300 shown in FIG. 4 is identical to the cross-sectional view of the foldable display device 100 shown in FIG. 2 except for the configuration of a third adhesive member 260 is different; and, therefore, the redundant description will be omitted.

The third adhesive member 260 can include a first sub-layer 260a and a second sub-layer 260b. The second sub-layer 260b can be disposed under the first sub-layer 260a. According to this embodiment, a part of the second sub-layer 260b can be formed as a non-adhesive portion 261 of the third adhesive member 260.

The upper and lower surfaces of the first sub-layer 260a have an adhesive strength, whereas the upper and lower surfaces of the second sub-layer 260b have an adhesive strength except for the non-adhesive portion 261 which does not have an adhesive strength. The entire upper surface of the third adhesive member 260 is adhesive, while the lower surface of the third adhesive member 260 is partially adhesive. Accordingly, the upper surface of the third adhesive member 260 can be attached to the surfaces of the blocking portions 151a of the opening pattern 151 of the rigid member 150. For example, the third adhesive member 260 partially includes the non-adhesive portion 261, and can be attached to the opening pattern 151 of the rigid member 150 with no additional adhesive member.

Accordingly, even when the display panel 110 is folded, the upper surface of the third adhesive member 260 is attached to the opening pattern 151 of the rigid member 150, to thereby suppress the non-adhesive portion 261 disposed thereunder from fluctuating (e.g., portions of the blocking portions 151a are stuck to an upper surface of the first sub-layer 260a and they do not separate from each other even when folded). Therefore, even when the display panel 110 is folded, the elements disposed above the opening pattern 151 of the rigid member 150 corresponding to the folding area FA can be supported by the non-adhesive portion 261 of the third adhesive member 260.

For example, even when the display panel 100 is folded, the non-adhesive portion 261 of the third adhesive member 260 can suppress the part of the display panel 110 located on the rigid member 150 corresponding to the folding area FA from being caved in or sagging. Therefore, it is possible to reduce the deformation in the folding area FA of the display panel 110. As a result, it is possible to suppress a caved-in shape from being generated and prevent any deformation from being noticeable by a user in the folding area FA of the display panel 110.

The features of the embodiments shown in FIGS. 2 to 4 described above may be summarized as follows:

Each of the display devices 100/200/300 includes a flexible substrate and adhesive members.

The flexible substrate may include a folding area FA which is a foldable region, and a non-folding area NFA which is non-foldable region.

The adhesive members can include a first adhesive layer 120 that can be attached to the rear surface of the flexible substrate, and a second adhesive layer 160/260 that can be disposed on the rear side of the first adhesive layer 120 and attached to a different support member 170 (e.g., support frame).

The second adhesive layer 160/260 can include a portion 161/261 corresponding to the foldable region FA of the flexible substrate has no adhesive strength, and a portion corresponding to the non-foldable region NFA of the flexible substrate and has a predetermined adhesive strength.

The second adhesive layer 160/260 can be a photosensitive adhesive layer that has been partially subjected to UV treatment, so that the non-adhesive portion 161/261 may be formed. By performing the UV treatment, the part of the second adhesive layer 160/260 corresponding to the folding area FA has no adhesive strength, while the part of the second adhesive layer 160/260 corresponding to the non-folding area NFA has a certain adhesive strength. Accordingly, the second adhesive layer 160/260 can have the non-adhesive portion 161/261 corresponding to the folding area FA, which is a foldable region of the flexible substrate. The adhesive portion of the second adhesive layer 160/260 has an adhesive strength similar to that of the first adhesive layer 120. Accordingly, the adhesive portion of the second adhesive layer 160/260 can be attached to the support member 170 (e.g., support frame) disposed on the rear surface of the second adhesive layer 160/260.

The non-adhesive portion 161/261 of the second adhesive layer 160/260 can correspond to the folding area FA of the flexible substrate, to thereby support the elements of the foldable display device 100/200/300 disposed on the flexible substrate. Accordingly, the non-adhesive portion 161/261 of the second adhesive layer 160/260 can suppress the part of the flexible substrate within the folding area FA from being caved in or sagging. As a result, the deformation of the part of the foldable display devices 100/200/300 corresponding to the folding area FA can be reduced, to thereby suppress a caved-in portion from being generated and perceived by a user.

Figure 5A:
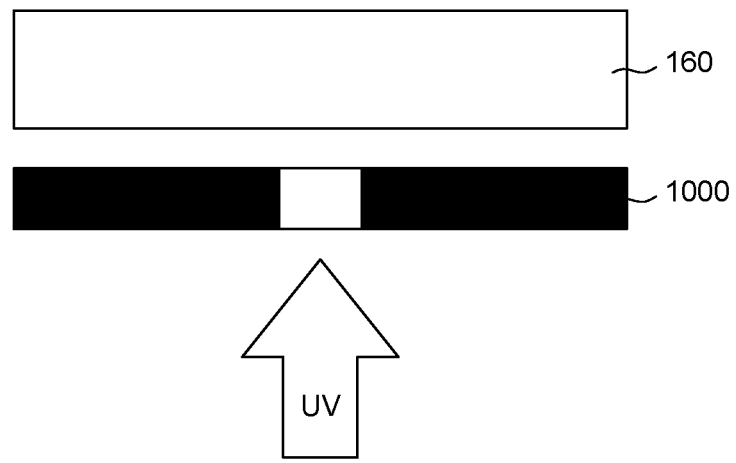
FIGS. 5A to 5C are cross-sectional views illustrating a method of forming the adhesive members shown in FIG. 2 according to an embodiment of the present disclosure.
Figure 5B:
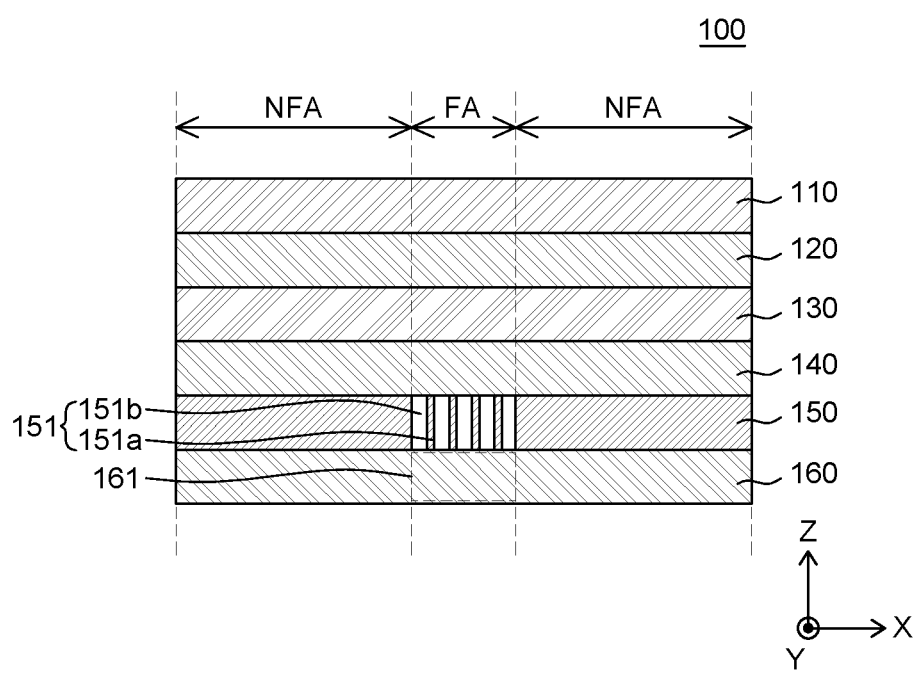
Figure 5C:
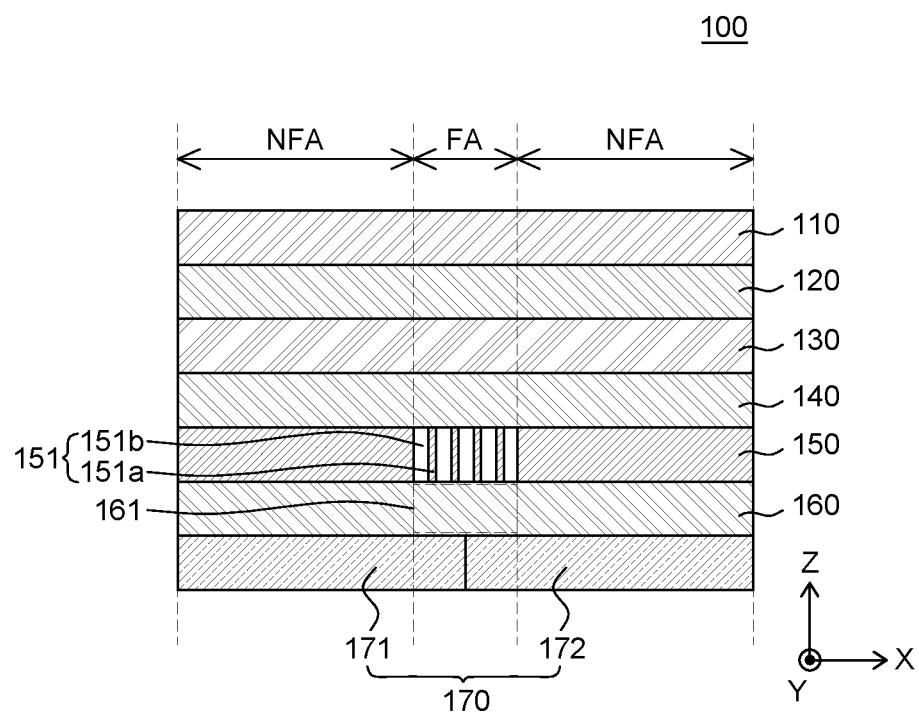

FIGS. 5A to 5C are cross-sectional views illustrating a method of forming the adhesive members shown in FIG. 2. Specifically, FIGS. 5A to 5C are cross-sectional views illustrating a method of forming the non-adhesive portion 161 of the third adhesive member 160 included in the foldable display device 100 shown in FIG. 2.

As shown in FIG. 5A, the third adhesive member 160 is formed. The forming the third adhesive member 160 can include forming the non-adhesive portion 161 by eliminating the adhesive strength of the part of the third adhesive member 160 corresponding to the folding area FA of the display panel 110.

Initially, a shielding mask 1000 is placed above the third adhesive member 160. The shielding mask 1000 includes a transmitting region and a light-blocking region. The transmitting region of the shielding mask 1000 is aligned with the part of the third adhesive member 160 corresponding to the folding area FA of the display panel 110. The light-blocking region of the shielding mask 1000 is aligned with the part of the third adhesive member 160 corresponding to the non-folding area NFA of the display panel 110. Accordingly, the shielding mask 1000 shields the part of the part of the third adhesive member 160 corresponding to the folding area FA of the display panel 110 so that area remains sticky, while it does not shield the part of the third adhesive member 160 corresponding to the non-folding area NFA of the display panel 110 so that area is dried or losing its adhesive strength.

After placing the shielding mask 1000, the properties of a part of the third adhesive member 160 is modulated. Since the transmitting region of the shielding mask 1000 is located in line with the part of the third adhesive member 160 corresponding to the folding area FA of the display panel 110, the properties can be changed only at the part of the third adhesive member 160. For example, the part of the third adhesive member 160 can be modulated by a light irradiation process such as UV irradiation.

After partially modulating the properties of the third adhesive member 160, the adhesive strength of the part corresponding to the folding area FA of the display panel 110 can be reduced or eliminated. Accordingly, the third adhesive member 160 can include the non-adhesive portion 161 corresponding to the folding area FA of the display panel 110. The third adhesive member 160 can be formed as, but is not limited to, a photo-sensitive OCA (optical clear adhesive) or a photo-sensitive OCR (optical clear resin).

Accordingly, only a part of each of the upper surface and the lower surface of the third adhesive member 160 corresponding to the non-folding area NFA of the display panel 110 may be attached to the elements, while the parts corresponding to the folding area FA may not be attached to the elements.

In addition, for example, as shown in FIG. 4, the third adhesive member 260 can be made up of a plurality of layers. The third adhesive member 260 can include a first sub-layer 260a and a second sub-layer 260b. Then, the properties of only one of the first sub-layer 260a and the second sub-layer 260b may be modulated. Specifically, the properties of the part of only one of the first sub-layer 260a and the second sub-layer 260b can be modulated through the light irradiation process, which corresponds to the folding area FA of the display panel 110. Accordingly, the adhesive strength of only the part of one of the first sub-layer 260a and the second sub-layer 260b can be eliminated.

After the non-adhesive portion 161 is formed in the third adhesive member 160, the third adhesive member 160 is disposed under the rigid member 150, as shown in FIG. 5B. A part of the upper surface of the third adhesive member 160 corresponding to the non-folding area NFA of the display panel 110 can be attached to the lower surface of the rigid member 150.

After disposing the third adhesive member 160, the support member 170 is disposed under the third adhesive member 160, as shown in FIG. 5C. The part of the lower surface of the third adhesive member 160 corresponding to the non-folding area NFA of the display panel 110 can be attached to the upper surface of the support member 170.

Figure 6:
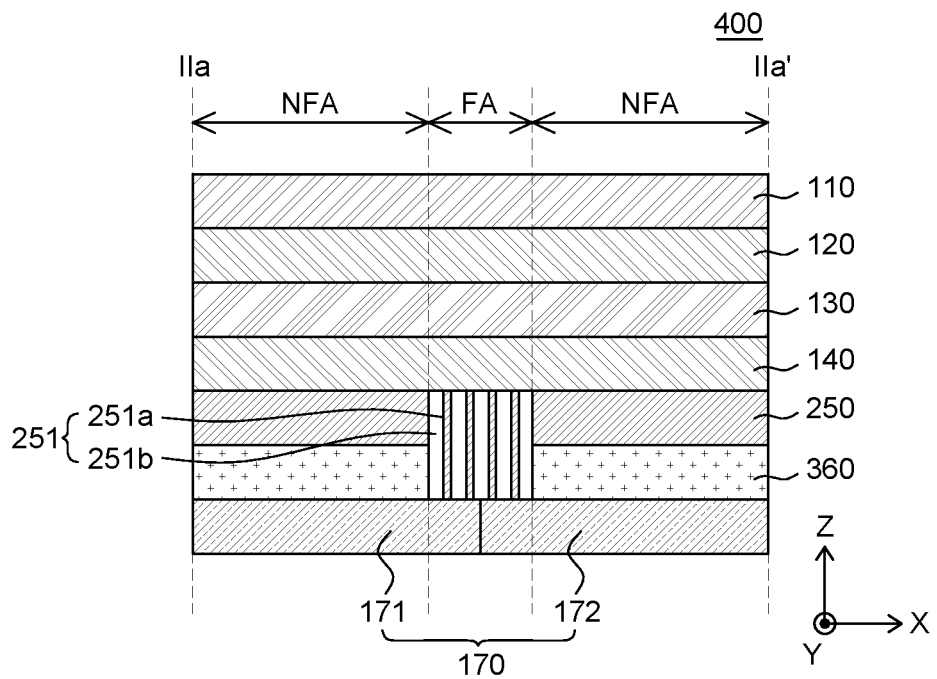
FIG. 6 is a cross-sectional view of a foldable display device according to another embodiment of the present disclosure.

FIG. 6 is a cross-sectional view of a foldable display device according to an embodiment of the present disclosure.

The cross-sectional view of a foldable display device 400 shown in FIG. 6 is identical to the cross-sectional view of the foldable display device 100 shown in FIG. 2 except for that the configuration of a rigid member 250 and a third adhesive member 360 are different in the display device 400; and, therefore, the redundant description will be omitted.

The rigid member 250 can be disposed under the support substrate 130. The rigid member 250 is made of a rigid material and is disposed under the display panel 110 to support the display panel 110. In addition, it supports the foldable display device 400 including the display panel 110 so that the foldable display device 400 maintains its shape. The rigid member 150 has an opening pattern 251 corresponding to the folding area FA of the display panel 110. The opening pattern 251 of the rigid member 250 can have a structure in which blocking portions (or blocking regions) 251a and open portions (or open regions) 151b are continuously and alternately arranged. With such structure, the opening pattern 251 of the rigid member 250 allows a part of the rigid member 250 that corresponds to the folding area FA of the display panel 110 to be folded. The rigid member 250 can have, but is not limited to, a thickness of approximately 0.18 mm to 0.22 mm.

The second adhesive member 140 can be disposed between the support substrate 130 and the rigid member 250. The second adhesive member 140 can be uniformly disposed on and across the entire lower surface of the support substrate 130 to thereby attach the support substrate 130 to the rigid member 250. The second adhesive member 140 can be made of, but is not limited to, the same material as the first adhesive member 120.

The support member 170 can be disposed under the rigid member 250. The support member 170 is to protect the elements thereon from impact. Accordingly, the support member 170 can have rigidity.

The support member 170 can include a first support member 171 and a second support member 172. The boundary between the first support member 171 and the second support member 172 corresponds to the folding area FA. Therefore, when the foldable display device 400 is folded, the first support member 171 can be spaced apart from the second support member 172 in the folding area FA.

The third adhesive member 360 can be disposed between the support member 170 and the rigid member 250. The third adhesive member 360 can be formed within the non-folding area NFA of the display panel 110, to attach the support member 170 to the rigid member 250. The third adhesive member 360 can be made of, but is not limited to, the same material as the second adhesive member 140.

Each of the elements (e.g., OLEDs) of the foldable display device 400 have a high flexibility and a small thickness. The rigid member has the opening pattern 251 corresponding to the folding area FA of the display panel 110. Therefore, the part of the foldable display device 400 corresponding to the folding area FA is weaker than the part thereof corresponding to the non-folding area NFA, and thus it may sag by the weight of the elements disposed above the opening pattern.

Accordingly, what is desirable is a member that can suppress the part of the foldable display device 400 that corresponds to the folding area FA from sagging.

The opening pattern 251 of the rigid member 250 corresponds to the folding area FA of the display panel 110 and includes an anti-sagging member. The anti-sagging member can be implemented by extending the plurality of blocking portions 251a.

Specifically, the opening pattern 251 of the rigid member 250 has a structure in which a plurality of blocking portions 251a and a plurality of open portions 251b are continuously and alternately arranged. There can be a gap between one of the blocking portions 251a of the opening pattern 251 of the rigid member 250 and another one adjacent thereto. Therefore, the part of the rigid member 250 corresponding to the folding area FA of the display panel 110 can be folded. Accordingly, even though the rigid member 250 is disposed under the display panel 110, the display panel 110 can be easily folded in the folding area FA.

The plurality of blocking portions 251a of the opening pattern 251 of the rigid member 250 can extend downward to the support member 170. The plurality of blocking portions 251a of the opening pattern 251 of the rigid member 250 can extend into to the space between the third adhesive members 360 that correspond to the non-folding area NFA of the display panel 110. The plurality of blocking portions 251a of the opening pattern 251 of the rigid member 250 can be extended downward and come in contact with the support member 170 disposed under the third adhesive member 360. Specifically, the plurality of blocking portions 251a of the opening pattern 251 of the rigid member 250 can be extended to come in contact with a part of the support member 170 corresponding to the folding area FA of the display panel 110.

When the display panel 110 is folded, the plurality of blocking portions 251a of the opening pattern 251 of the rigid member 250 can be separated from the part of the support member 170 corresponding to the non-folding area NFA of the display panel 110. Accordingly, the plurality of blocking portions 251a of the opening pattern 251 of the rigid member 250 rarely affects the flexibility of the foldable display device 400.

When the display panel 110 is not folded, the plurality of blocking portions 251a of the opening pattern 251 of the rigid member 250 can come in contact with the support member corresponding to the folding area FA of the display panel 110 to thereby support the opening pattern 251. Then, the plurality of blocking portions 251a of the opening pattern 251 of the rigid member 250 can come in contact with the elements disposed above the opening pattern 251. Accordingly, even though the plurality of blocking portions 251a of the opening pattern 251 provided in the rigid member 250 support the elements disposed above the opening pattern 251, the weight of the elements can be transferred to the support member 170 in contact with the plurality of blocking portions 251a. As a result, the weight of the elements disposed above the rigid member 250 can be spread to the support member 170 under the rigid member 250.

Accordingly, the plurality of blocking portions 251a of the opening pattern 251 of the rigid member 250 can be extended to come in contact with the support member 170, to thereby support the part thereof corresponding to the folding area FA of the display panel 110. The weight of the part of the display panel 110 corresponding to the folding area FA can be transferred to the part of the support member 170 in contact with the plurality of blocking portions 251a of the opening pattern 251 of the rigid member 250. The weight of the part of the display panel 110 transferred to the support member 170 can be spread to the support member 170 under the rigid member 250. The plurality of blocking portions 251a of the opening pattern 251 of the rigid member 250 can suppress the part of the display panel corresponding to the folding area FA located on the rigid member from sagging. As a result, since the deformation of the display panel 110 in the folding area FA can be reduced, it is possible to suppress unevenness from being perceived by a user in the folding area FA of the display panel 110.

Figure 7:
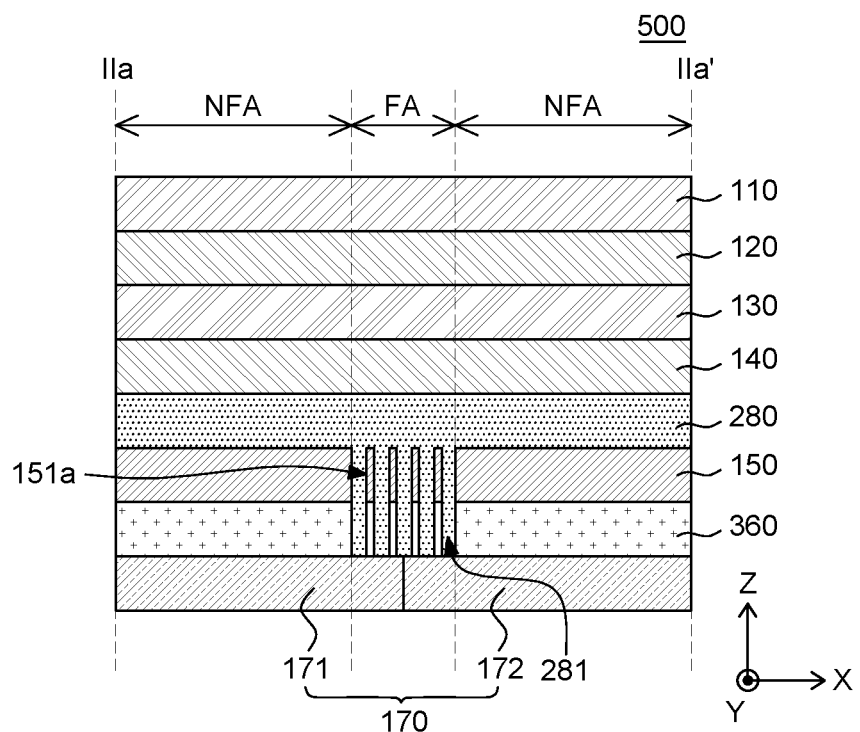
FIG. 7 is a cross-sectional view of a foldable display device according to an embodiment of the present disclosure.

FIG. 7 is a cross-sectional view of a foldable display device according to another embodiment of the present disclosure.

The cross-sectional view of a foldable display device 500 shown in FIG. 7 is identical to the cross-sectional view of the foldable display device 100 shown in FIG. 2 except for that the configuration of a flexibility-improving adhesive member 280, a rigid member 150 and a third adhesive member 360 are different; and, therefore, the redundant description will be omitted.

The flexibility-improving adhesive layer 280 is disposed between the display panel 110 and the rigid member 150. The flexibility-improving adhesive layer 280 can be attached to and formed integrally with the rigid member 150. Therefore, the flexibility-improving adhesive layer 280 may be disposed between the rigid member 150 and the second adhesive member 140.

The flexibility-improving adhesive layer 280 can be formed of a material having elasticity for suppressing impact from being transferred to the display panel 110 as well as flexibility for the folding display device 100. Therefore, the flexibility-improving adhesive layer 280 can protect the display panel 110 disposed above the second adhesive member 140. For example, the flexibility-improving adhesive layer 280 can be made of, but is not limited to, a material such as silicon (Si).

The third adhesive member 360 can be disposed between the support member 170 and the rigid member 150. The third adhesive member 360 can be formed within the non-folding area NFA of the display panel 110, to attach the support member 170 to the rigid member 150. The third adhesive member 360 can be made of, but is not limited to, the same material as the second adhesive member 140.

Each of the elements of the foldable display device 500 have a high flexibility and a small thickness. The rigid member has the opening pattern corresponding to the folding area FA of the display panel 110. Therefore, the part of the foldable display device 500 corresponding to the folding area FA is weaker than the part thereof corresponding to the non-folding area NFA, and thus it may sag by the weight of the elements disposed above the opening pattern.

Accordingly, what is desirable is a member that can suppress the part of the foldable display device 500 corresponding to the folding area FA from sagging.

The flexibility-improving adhesive layer 280 can include an anti-sagging member within the folding area FA of the display panel 110.

Specifically, the flexibility-improving adhesive layer 280 may be attached to and formed integrally with the rigid member 150. The extended portions 281 of the flexibility-improving adhesive layer 280 can be formed in line with the opening pattern 150 of the rigid member 251 corresponding to the folding area FA of the display panel 100. The extended portions 281 of the flexibility-improving adhesive layer 280 can be extended into the open portions 251b of the opening pattern 251, respectively. Accordingly, the open portions 251b of the opening pattern 251 can be filled with the extended portions 281 of the flexibility-improving adhesive layer 280, respectively. Accordingly, the blocking portions 251a of the opening pattern 151 of the rigid member 150 and the extended portions 281 of the flexibility-improving adhesive layer 280 can be continuously and alternately arranged.

The extended portions 281 of the flexibility-improving adhesive layer 280 can also extend downward toward the support member 170. The extended portions 281 of the flexibility-improving adhesive layer 280 can be extended to the space in-between the third adhesive members 360 that correspond to the non-folding area NFA of the display panel 110. The extended portions 281 of the flexibility-improving adhesive layer 280 can be extended downward and come in contact with the support member 170 disposed below the third adhesive member 360. For example, the extended portions 281 of the flexibility-improving adhesive layer 280 can be extended to come in contact with a part of the support member 170 corresponding to the folding area FA of the display panel 110.

The extended portions 281 of the flexibility-improving adhesive layer 280 can be extended to come in contact with the support member 170, to thereby support the part of the display panel 110 corresponding to the folding area FA. The weight of the part of the display panel 110 corresponding to the folding area FA can be transferred to the part of the support member 170 in contact with the extended portions 281 of the flexibility-improving adhesive layer 280. The weight of the part of the display panel 110 transferred to the support member 170 can be spread to the support member 170 under the extended portions 281 of the flexibility-improving adhesive layer 280. Accordingly, it is possible to suppress the part of the display panel 110 disposed on the flexibility-improving adhesive layer 280 within the folding area FA from sagging. As a result, since the deformation of the display panel 110 in the folding area FA can be reduced, it is possible to suppress unevenness from being perceived by a user in the folding area FA of the display panel 110.

In addition, the extended portions 281 of the flexibility-improving adhesive layer 280 have an adhesive strength. Accordingly, the extended portions 281 of the flexibility-improving adhesive layer 280 can come in contact with and be stuck to a part of the support member 170 corresponding to the folding area FA of the display panel 110. Accordingly, when the display panel 110 is not folded, the extended portions 281 of the flexibility-improving adhesive layer 280 can suppress the support member 170 from fluctuating or moving, and thus the support member 170 can firmly support the part of the display panel 110 within the folding area FA.

The features of the embodiments shown in FIGS. 6 and 7 described above may be summarized as follows:

Each of the foldable display devices 400/500 includes a flexible substrate, adhesive members, a rigid member 250/150, and a support member 170.

The flexible substrate can include a folding area FA which is a foldable region, and a non-folding area NFA which is non-foldable region.

The adhesive members can include a first adhesive layer 120 that can be attached to the rear surface of the flexible substrate, and a second adhesive layer 360 that can be attached to the rigid member 250 disposed on the rear surface of the first adhesive layer 120. The second adhesive layer 360 can be attached to a part of the rigid member 250 corresponding to the folding area FA, which is a foldable region of the flexible substrate.

The support member 170 can be disposed on the rear surface of the adhesive member and can be attached to the second adhesive layer 360. Since the second adhesive layer 360 is disposed only in the non-foldable region NFA of the flexible substrate, the support member 170 and the second adhesive layer 360 can be attached together only within the non-folding region NFA.

The display device 400/500 can have a specific feature that comes in contact with the part of the support member 170 corresponding to the folding area FA, which is a folding region of the flexible substrate.

The feature can be portions 251*a* that correspond to the folding area FA of the flexible substrate and are extended to come in contact with the support member 170. The extended portions 251*a* of the rigid member 250 can be implemented through a half-tone shielding mask process.

In addition, the adhesive member can also include a flexibility-improving adhesive layer 280 between the first adhesive layer 120 and the rigid member 150. The feature can be protruding portions 281 that allow the flexibility-improving adhesive layer 280 to come in contact with the part of the support member 170 within the foldable region FA of the flexible substrate. The flexibility-improving adhesive layer 280 can be produced by being attached the rigid member 150 via a mold process having a concave pattern. Accordingly, the protruding portions 281 of the flexibility adhesive layer 280 can be produced by penetrating the part of the rigid member 150 within the folding area FA of the flexible substrate.

The extended portions 151*a* of the rigid member 150 or the protruding portions 281 of the flexibility-improving adhesive layer 280 can support the elements of the foldable display device 400/500 disposed on the flexible substrate within the folding area FA of the flexible substrate. Accordingly, the extended portions 151*a* of the rigid member 150 or the protruding portions 281 of the flexibility-improving adhesive layer 280 can suppress the part of the flexible substrate within the folding area FA from being caved in or sagging. As a result, the deformation of the part of the foldable display devices 400/500 corresponding to the folding area FA can be reduced, to thereby suppress a caved-in portion from being generated and perceived.

FIGS. 8A to 8D are cross-sectional views illustrating a method of forming the rigid member 250 shown in FIG. 6. Specifically, FIGS. 8A to 8D are cross-sectional views illustrating a method of forming the blocking portions 251*a* of the opening pattern 251 of the rigid member 250 included in the foldable display device 300 shown in FIG. 6.

The blocking portions 251*a* of the opening pattern 251 of the rigid member 250 can be a feature that is extended to come in contact with a part of the support member 170 corresponding to the folding area FA of the display panel 110. Therefore, the rigid member 250 can have the feature to serve as an anti-sagging member. Since the rigid member 250 serving as the anti-sagging member can be formed as the metal layer 1250, a method for forming the rigid member 250 will be described in detail below.

Figure 8A:
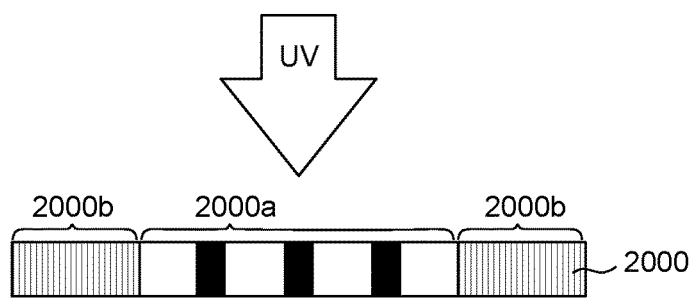
FIGS. 8A to 8D are cross-sectional views illustrating a method of forming the rigid member shown in FIG. 6.
Figure 8A:
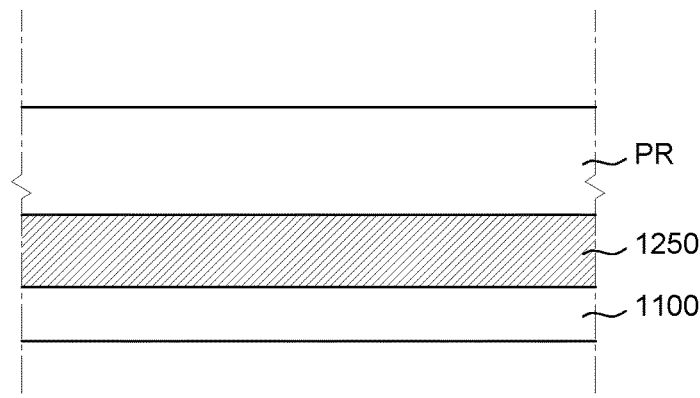

As shown in FIG. 8A, a half-tone shielding mask is placed above the metal layer 1250.

The metal layer 1250 is formed on a formation substrate 1100 with the material of the rigid member 250. A photosensitive resin PR such as a photoresist is applied onto the metal layer 1250. A specific region of the photosensitive resin PR can be selectively irradiated with light by the half-tone shielding mask 2000.

The half-tone shielding mask 2000 has transmitting regions through which light is transmitted, and light-blocking regions through which light is not transmitted. The half-tone shielding mask 2000 has a dense portion 2000*b* in which the transmitting regions and the light-blocking regions are densely arranged, in line with a part of the metal layer 1250 corresponding to the non-folding area NFA of the display panel 110. In addition, the half-tone shielding mask 2000 has an expanded portion 2000*b* in which the transmitting regions and the light-blocking regions are relatively sparsely arranged, in line with a part of the metal layer 1250 corresponding to the folding area FA of the display panel 110. The expanded portion 2000*a* of the half-tone shielding mask 2000 is in line with the blocking portions 251*a* of the opening pattern 251 of the rigid pattern 250 after the metal layer 1250 is patterned. Therefore, the width of the light-blocking regions of the expanded portion 2000*a* can be determined taking into account the locations the blocking portions 251*a* of the opening pattern 251 of the rigid member 250.

After the half-tone shielding mask 2000 is placed above the metal layer 1250, a light irradiation process is performed onto the photosensitive resin PR.

During the light irradiation process, the expanded portion 2000*a* of the half-tone shielding mask 2000 is aligned with a part of the metal layer 1250 corresponding to the folding area FA of the display panel 110. In the expanded portion 2000*a* of the half-tone shielding mask 2000, the transmitting regions and the light-blocking regions have a large width. Accordingly, during the light irradiation process, the photosensitive resin PR on the part of the metal layer 1250 in line with the transmitting regions of the expanded portion 2000*a* of the half-tone shielding mask 2000 can be irradiated with light, while the photosensitive resin PR on the part of the metal layer 1250 in line with the light-blocking regions cannot be irradiated with light. As a result, the photosensitive resin PR on the part of the metal layer 1250 in line with the transmitting regions of the expanded portion 2000*a* of the half-tone shielding mask 2000 can be modulated, while the photosensitive resin PR on the part of the metal layer 1250 in line with the light-blocking regions cannot be modulated.

During the light irradiation process, the dense portion 2000*b* of the half-tone shielding mask 2000 is aligned with the rest part of the metal layer 1250 corresponding to the non-folding area NFA of the display panel 110. As the transmitting regions and the light-blocking regions of the dense portion 2000*b* of the half-tone shielding mask 2000 has a narrow width, the light passing through one transmitting region can overlap with the light passing through the adjacent transmitting region. Accordingly, the photosensitive resin PR on the rest part of the metal layer 1250 in line with the dense portion 2000b can generally receive light in the light irradiation process. Accordingly, the photosensitive resin PR on the rest part of the metal layer 1250 in line with the dense portion 2000b can be generally modulated.

Since some of the light can be blocked by the light-blocking regions of the dense portion 2000b, the photosensitive resin PR under the dense portion 2000b of the half-tone shielding mask 2000 can be irradiated by a smaller amount of light than the photosensitive resin PR under the expanded portion 2000a. As a result, the photosensitive resin PR under the dense portion 2000b of the half-tone shielding mask 2000 can be partially modulated, e.g., only the upper layer thereof, or less modulated than the photosensitive resin PR under the expanded portion 2000a.

Figure 8B:
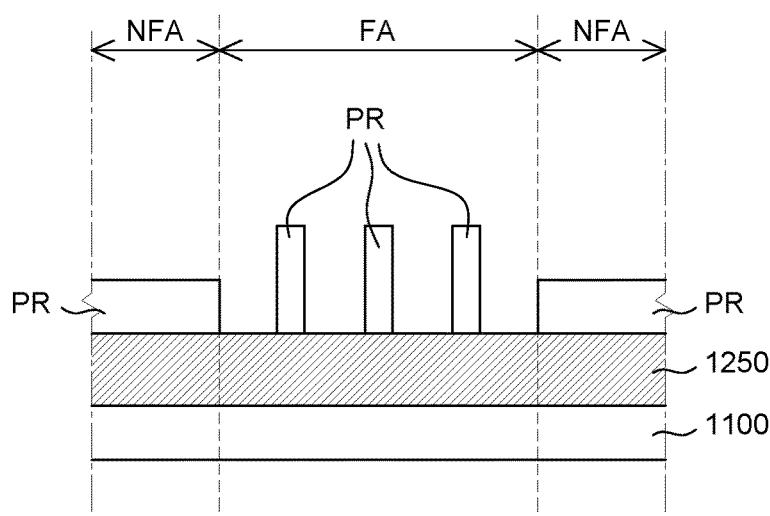

After irradiating the photosensitive resin PR with light, the photosensitive resin PR is partially removed as shown in FIG. 8B. Further, a part of the photosensitive resin (PR) modulated during the light irradiation process can be removed.

From the photosensitive resin PR on the part of the metal layer 1250 in line with the folding area FA of the display panel 110, the part of the photosensitive resin PR under the transmitting regions of the expanded portion 2000a of the half-tone mask 2000 is removed, while the part of the photosensitive resin PR under the light-blocking regions is not removed. In addition, as the photosensitive resin PR on the rest part of the metal layer 1250 in line with the non-folding area NFA of the display panel 110 is partially or less modulated, a part of the photosensitive resin PR is removed, such that it remains on the metal layer 1250 at a very small thickness.

Figure 8C:
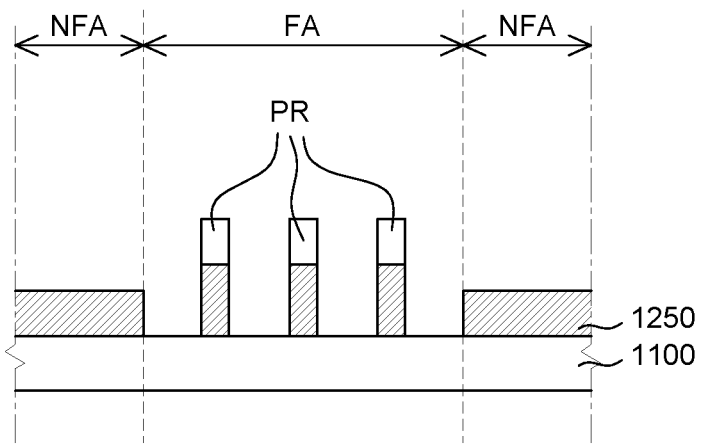

After partially removing the photosensitive resin PR, the metal layer 1250 is etched as shown in FIG. 8C.

A part of the metal layer 1250 in line with the folding area FA of the display panel 110, where no photosensitive resin remains, can be etched and completely removed. A part of the metal layer 1250 in line with the folding area FA of the display panel 110, where some of the photosensitive resin PR remains, is not removed, while a part of the remaining photosensitive resin PR is etched and removed.

In the rest part of the metal layer 1250 in line with the non-folding area NFA of the display panel 110, the photosensitive resin PR remains thereon at a small thickness, such that the photosensitive resin PR can be etched and removed. At this time, the remaining part of the metal layer 1250 under the photosensitive resin PR can also be partially etched and removed.

As the rest part of the metal layer 1250 in line with the non-folding area NFA of the display panel 110 is partially etched, it can be thinner than the part of the metal layer 1250 in line with the folding area FA of the display panel 110. Accordingly, the metal layer 1250 in line with the folding area FA of the display panel 110 can be formed thicker than the rest part of the metal layer 1250 in line with the non-folding area NFA.

Figure 8D:
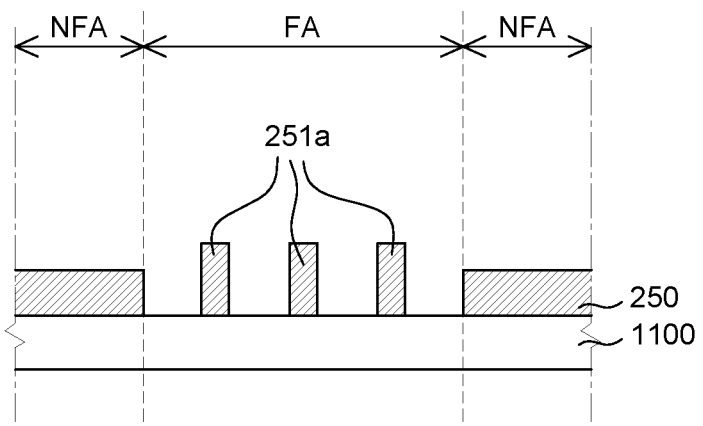

After the etching the metal layer 1250, the remaining photosensitive resin PR is removed as shown in FIG. 8D.

The part of the metal layer 1250 in line with the folding area FA of the display panel 110 becomes an opening pattern of the rigid member 250. The part of the rigid member 250 formed of the metal layer 1250 corresponding to the folding area FA of the display panel 110 can be thicker than the rest part of the rigid member 250 corresponding to non-folding area NFA. Accordingly, the blocking portions 251a of the opening pattern of the rigid member 250 corresponding to the folding area FA of the display panel 110 can be patterned so that they protrude drive the surface of the rigid member 250. Accordingly, the rigid member 250 can serve as an anti-sagging member.

Figure 9A:
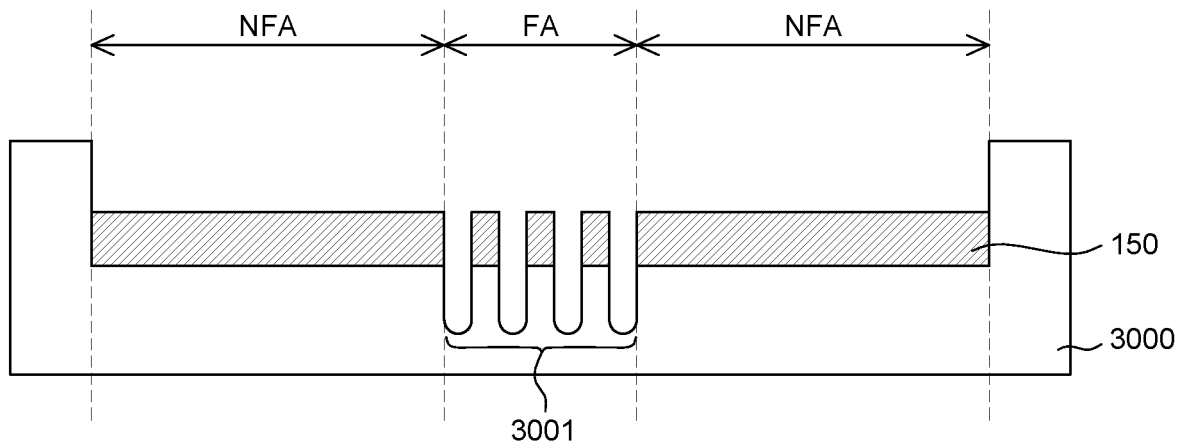
FIGS. 9A to 9C are cross-sectional views illustrating a method of forming the flexibility-improving adhesive layer shown in FIG. 7.
Figure 9B:
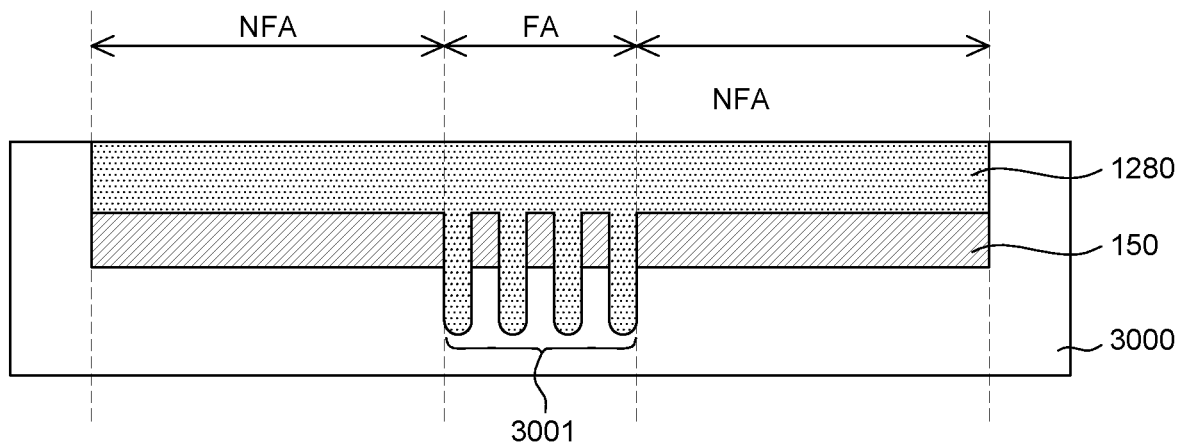
Figure 9C:
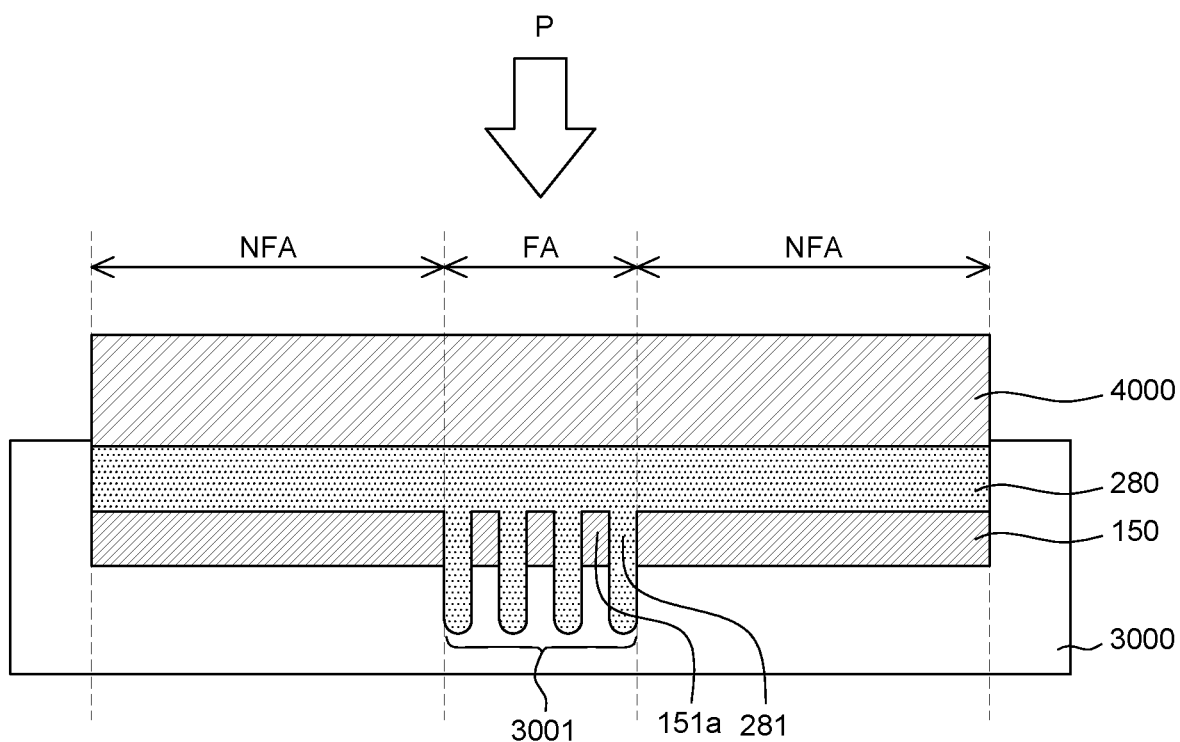

FIGS. 9A to 9C are cross-sectional views illustrating a method of forming the flexibility-improving adhesive layer shown in FIG. 7. FIGS. 9A to 9C are cross-sectional views for illustrating a method of forming the extended portions 281 of the flexibility-improving adhesive layer 280 of the foldable display device 400 shown in FIG. 7.

The extended portions 281 of the flexibility-improving adhesive layer 280 can be a feature that protrudes from the lower surface of the rigid member 150 to come in contact with a part of the support member 170 corresponding to the folding area FA of the display panel 110. Therefore, the flexibility-improving adhesive layer 280 can have the feature to serve as the anti-sagging member. Since the flexibility-improving adhesive layer 280 serving as the anti-sagging member can be formed together with the rigid member 150, a method of forming the same will be described in detail below.

As shown in FIG. 9A, a rigid member 150 is placed inside a mold 3000.

The upper surface of the mold (or a frame) 3000 has a concave-shape for accommodating the rigid member 150 therein. The upper surface of the accommodating portion of the mold 3000 has a concave pattern 3001. The rigid member 150 is located in the accommodating portion of the mold. The open portions of the opening pattern of the rigid member 150 are formed conforming to the concave pattern 3001 of the mold 3000.

After placing the rigid member 150 in the accommodating portion of the mold 3000, a fluent material 1280 for forming the flexibility-improving adhesive layer 280 can be applied onto the rigid member 150, as shown in FIG. 9B. The fluent material 1280 can be, but is not limited to, a material having fluidity and viscosity such as silicon (Si). The fluidity of the fluent material 1280 can be reduced or eliminated through a curing process.

The fluent material 1280 can be applied to cover the entire upper surface of the rigid member 150. The fluent material 1280 can flow into the open portions of the opening pattern of the rigid member 150. Also, the concave pattern 3001 of the mold 3000 can be filled with the fluent material 1280. Accordingly, the flexibility-improving adhesive layer 280 formed of the fluent material 1280 can flow into the open portions of the opening pattern of the rigid member 150 and can be attached to the rigid member 150. In addition, the flexibility-improving adhesive layer 280 can have the extended portions 281 as the fluent material 1280 in the concave pattern 3001 of the mold 3000 flows. The extended portions 281 of the flexibility-improving adhesive layer 280 can be formed in a shape conforming to the concave pattern 3001 of the mold 3000. The depth of the concave pattern 3001 of the mold 3000 can be equal to or larger than the length of the extended portions 281 of the flexibility-improving adhesive layer 280.

After applying the fluent material 1280, the fluent material is pressed and cured, as shown in FIG. 9C.

The fluent material 1280 can be pressed by pressing P it against the upper surface thereof with a press 4000. As a result, the spaces in the concave pattern 3001 of the mold 3000 can be filled with the fluent material 1280. By doing so, the spaces in the concave pattern 3001 of the mold 3000 can be eliminated. Accordingly, the extended portions 281 of the flexibility-improving adhesive layer 280 can be formed in the shape conforming to the concave pattern 3001 of the mold 3000, with the fluent material 1280.

The fluidity of the pressed fluent material 1280 can be reduced by performing a curing process. Therefore, the fluent material 1280 can be formed as the flexibility-improving adhesive layer in the shape conforming to the accommodating portion of the mold 3000 and the concave pattern in the accommodating portion. The curing process can be performed, for example, by photocuring, thermosetting or chemical curing.

The embodiments of the present disclosure can also be described as follows:

According to an aspect of the present disclosure, a foldable display device includes: a display panel comprising a folding area, and a non-folding area extended from the folding area in at least a direction; a rigid member disposed under the display panel and having an opening pattern corresponding to the folding area; a support member under the rigid member; and an adhesive member between the support member and the rigid member within the non-folding area. The adhesive member includes a non-adhesive portion that is extended to an area corresponding to the folding area between the support member and the rigid member to be disposed under the opening pattern.

The non-adhesive portion can support the opening pattern and can suppress a part of the display panel corresponding to the folding area from sagging.

The non-adhesive portion can be separated from a part of the support member corresponding to the folding area when the display panel is folded.

The foldable display device can further include: a flexibility-improving adhesive layer between the display panel and the rigid member.

The flexibility-improving adhesive layer can have extended portions for filling open regions of the opening pattern of the rigid member.

The extended portions can come in contact with the non-adhesive portion to suppress the non-adhesive portion from fluctuating.

The non-adhesive portion can come in contact with the extended portions to suppress the part of the display panel from sagging when the display panel is folded.

The adhesive member can include a first sub-layer and a second sub-layer disposed under the first sub-layer, and a part of the second sub-layer corresponding to the folding area can be formed as the non-adhesive portion.

According to an another aspect of the present disclosure, a method of fabricating a foldable display device, which includes a display panel including a folding area and a non-folding area extended from the folding area in at least a direction, includes: forming an adhesive member, and the forming the adhesive member comprises suppressing an adhesive strength of a part of the adhesive member corresponding to the folding area.

The suppressing the adhesive strength can include placing a transmitting region of a shielding mask in line with the part of the adhesive member, placing a light-blocking region of the shielding mask in line with a rest part of the adhesive member corresponding to the non-folding area, and changing properties of the part of the adhesive member.

The changing the properties of the part of the adhesive member can include performing a light irradiation process.

The changing the properties of the part of the adhesive member can include suppressing an adhesive strength of a part of a first sub-layer or a second sub-layer of the adhesive member.

The method can further include: after the suppressing the adhesive strength, attaching a part of an upper surface of the adhesive member to a rigid member under the display panel.

The method can further include: after the attaching the part of the upper surface of the adhesive member, attaching a support member under the adhesive member to a lower surface of the adhesive member corresponding to the non-folding area.

According to an another aspect of the present disclosure, a foldable display device includes a flexible substrate including a foldable region and a non-foldable region; and an adhesive member having a first adhesive layer configured to be attached to a rear surface of the flexible substrate, and a second adhesive layer disposed on a rear side of the first adhesive layer and configured to be attached to a different support frame.

The second adhesive layer of the adhesive member can have a portion that corresponds to the foldable region and has been processed to have no adhesive strength, and a portion that corresponds to the non-foldable region and has a predetermined adhesive strength.

The portion of the second adhesive layer having no adhesive strength has been subjected to UV treatment.

The portion of the second adhesive layer having the predetermined adhesive strength can have an adhesive strength similar to that of the first adhesive layer, and is attached to the support frame.

Thus far, embodiments of the present disclosure have been described in detail with reference to the accompanying drawings. However, the present disclosure is not limited to the embodiments, and modifications and variations can be made thereto without departing from the technical idea of the present disclosure. Accordingly, the embodiments described herein are merely illustrative and are not intended to limit the scope of the present disclosure. The technical idea of the present disclosure is not limited by the embodiments. Therefore, it should be understood that the above-mentioned embodiments are not restrictive, but are examples. The scope of protection sought by the present invention is defined by the appended claims and all equivalents thereof are construed to be within the true scope of the present disclosure.

What is claimed is:

1. A foldable display device comprising:
   a display panel including a folding area and a non-folding area;
   a rigid member disposed under the display panel, the rigid member including an opening pattern corresponding to the folding area;
   a support member disposed under the rigid member; and
   an adhesive member disposed between the support member and the rigid member,
   wherein the adhesive member includes a non-adhesive portion disposed between the support member and the rigid member, and
   wherein the non-adhesive portion of the adhesive member overlaps with the opening pattern in the rigid member, and the non-adhesive portion of the adhesive member overlaps with the folding area of the display panel.

2. The foldable display device of claim 1, wherein the non-adhesive portion is configured to support the opening pattern and suppress a part of the folding area of the display panel from sagging.

3. The foldable display device of claim 1, wherein the non-adhesive portion is separated from a part of the support member corresponding to the folding area when the display panel is folded.

4. The foldable display device of claim 1, further comprising:
a flexibility-improving adhesive layer disposed between the display panel and the rigid member.

5. The foldable display device of claim 4, wherein the flexibility-improving adhesive layer includes extended portions, and
wherein the extended portions of the flexibility-improving adhesive layer are disposed in open regions of the opening pattern in the rigid member.

6. The foldable display device of claim 5, wherein the extended portions of the flexibility-improving adhesive layer contact the non-adhesive portion of the adhesive member.

7. The foldable display device of claim 6, wherein the contact between the non-adhesive portion and the extended portions is configured to suppress part of the display panel from sagging when the display panel is folded or suppress the non-adhesive portion from fluctuating.

8. The foldable display device of claim 5, wherein the extended portions of the flexibility-improving adhesive layer extend through rigid member and through the adhesive member to contact an upper surface of the support member.

9. The foldable display device of claim 1, wherein the adhesive member comprises a first sub-layer and a second sub-layer disposed under the first sub-layer, and
wherein a part of the second sub-layer corresponding to the folding area forms the non-adhesive portion of the adhesive member.

10. The foldable display device of claim 1, wherein the opening pattern in the rigid member includes open regions and blocking regions arranged in an alternating matter, and wherein the blocking regions in the opening pattern of the rigid member extend through the adhesive member to contact an upper surface of the support member.

11. A foldable display device comprising:
a flexible substrate including a foldable region and a non-foldable region;
a rigid member disposed under the flexible substrate, the rigid member including an opening pattern corresponding to the folding area; and
an adhesive member including:
a first adhesive layer configured to be attached to a rear surface of the flexible substrate, and
a second adhesive layer disposed between the rigid member and a support member, the second adhesive layer being configured to be attached to the rigid member and the support frame,
wherein the first adhesive layer is disposed between the flexible substrate and the rigid member.

12. The foldable display device of claim 11, wherein the second adhesive layer of the adhesive member includes:
a first portion corresponding to the foldable region, the first portion having a non-adhesive property, and
a second portion corresponding to the non-foldable region, the second portion having an adhesive property.

13. The foldable display device of claim 12, wherein the first portion of the second adhesive layer having the non-adhesive property has been subjected to UV treatment.

14. The foldable display device of claim 13, wherein the adhesive property of the second portion is similar to an adhesive property the first adhesive layer, and
wherein the second portion of the second adhesive layer having the adhesive property is attached to the support frame.

* * * * *